United States Patent [19]
Gloaguen

[11] Patent Number: 5,089,720
[45] Date of Patent: Feb. 18, 1992

[54] BRIDGE TYPE SWITCHING CIRCUIT HAVING A SINGLE SWITCHABLE CURRENT SOURCE

[75] Inventor: Gilbert Gloaguen, Tourville/Odon, France

[73] Assignee: U.S. Philips Corporation, New York, N.Y.

[21] Appl. No.: 542,219

[22] Filed: Jun. 21, 1990

[30] Foreign Application Priority Data

Jun. 23, 1989 [FR] France .................... 89 08418

[51] Int. Cl.$^5$ .................... H03K 17/74; G11C 27/02
[52] U.S. Cl. .................... 307/353; 307/257; 307/494
[58] Field of Search .......... 307/352, 353, 257, 259, 307/491, 494; 328/151

[56] References Cited

U.S. PATENT DOCUMENTS

| | | | |
|---|---|---|---|
| 3,643,110 | 2/1972 | Thompson | 307/353 |
| 3,721,829 | 3/1973 | Benson | 307/352 |
| 4,518,921 | 5/1985 | Logan | 307/353 |
| 4,540,902 | 9/1985 | Ishikawa | 307/352 |
| 4,636,659 | 1/1987 | Sugimoto | 307/353 |
| 4,728,819 | 3/1988 | Vu | 307/353 |

Primary Examiner—John Zazworsky
Attorney, Agent, or Firm—Bernard Franzblau

[57] ABSTRACT

A sample-and-hold circuit comprising a diode bridge that includes a first serial branch including first ($T_1$) and second ($D_3$) D.C. diodes connected in parallel with a second serial branch including third ($T_2$) and fourth ($D_4$) D.C. diodes. At least one end (B) common to the above two serial branches is connected to a first switchable current source ($T_3$, $T_4$, I) providing a sampling state in which the current source (I) is coupled to the first common end (B) and a blocking state in which it is uncoupled from the first common end (B). The first branch comprises an input terminal (E) for receiving an input voltage, and the second serial branch includes an output terminal (S) connected to a memory capacitor. In order to switch the bridge by means of a single current source, the third diode is constituted by the base-emitter path of a first transistor ($T_2$) whose collector is connected to a supply voltage source. The second common end (A) of said two branches is now the junction point of the first ($T_1$) and third ($T_2$) diodes and a first resistor (R) is inserted between the second common end (A) and the supply voltage source ($V_{cc}$). The first switchable current source is connected to the second common end (A) in the blocking state.

25 Claims, 2 Drawing Sheets

BRIDGE TYPE SWITCHING CIRCUIT HAVING A SINGLE SWITCHABLE CURRENT SOURCE

FIELD OF THE INVENTION

The present invention relates to a switching circuit, specifically for a sample-and-hold circuit, comprising a diode bridge that includes a first serial branch comprising first and second diodes, connected in parallel to a second serial branch comprising third and fourth diodes. At least one first end common to the above two serial branches is connected to a first switchable current source having a first state in which it is coupled to the first common end and a second state in which it is uncoupled from the first common end. The first serial branch has an input terminal at the junction point of the first and second diodes and is arranged to receive an input voltage. The second serial branch has an output terminal at the junction point of the third and fourth diodes. In the case where the switching circuit is used in a sample-and-hold circuit, the output terminal is connected to a memory capacitor, the first state is a sampling state and the second state is a blocking state.

Prior-art sample-and-hold circuits feature simultaneous switching of two current sources, the one realised with PNP transistors and the other with NPN transistors. In the usual manufacturing methods of integrated circuits the PNP transistors are distinctly slower. Furthermore, perfect synchronization of the switching of different types of transistors is hard to obtain.

U.S. Pat. No. 3,597,633 discloses a switching circuit, specifically for a sample-and-hold circuit, in which a single switching operation is performed, that of a transistor, but this circuit does not provide the switching of genuine current sources.

SUMMARY OF THE INVENTION

According to the present invention, a switch for a sample-and-hold circuit is proposed in which the switching of a single current source, preferably performed with the aid of NPN transistors, is sufficient to achieve the main desired object.

A switching circuit according to the invention is characterised in that the third diode is constituted by the base-emitter path of a first transistor whose collector is connected to a supply voltage source, in that a second end common to said two branches is the junction point of the first and third diodes, and in that it comprises a first resistor inserted between said second common end and said supply voltage source, and in that the first switchable current source is arranged to be coupled to the second common end in the second state.

The first switchable current source may comprise a first differential stage arranged to switching a current source of a given amplitude between said first and second common ends respectively, in the sampling state and in the blocking state, in response to a control signal.

The circuit according to the invention may comprise in a first embodiment a current generator arranged to inject at the second common end an equalizing current that varies with the input voltage so as to render the balance of the bridge independent of said input voltage.

The current generator may thus be a second switchable differential stage arranged in a manner such that said equalizing current is derived from a second current source of a given amplitude. The second differential stage may comprise second and third transistors whose emitters are coupled through second and third series-connected resistors having a junction point which is connected to the second current source. The base of the second transistor is arranged to receive said input voltage. The collector of the second transistor is connected to the supply voltage source. The base of the third transistor is connected to receive a reference voltage and its collector is connected to said second common end. The latter embodiment makes it possible to obtain a good linearity in the equalization.

The second current source may have the following value:

$$I' = \frac{V_H - V_B}{R}$$

with $R = \frac{2}{I}(V_{cc} - V_{BE} - V_H)$ $V_H$: maximum value of the input signal $V_e$
$V_B$: minimum value of the input signal $V_e$
R: value of the first resistor
$V_{BE}$: base-emitter voltage of a transistor
$V_{cc}$: supply voltage
I: amplitude of the first current source of a given value.

In this manner all current I' is used to realise the desired equalization.

An optimal linearization of the correction is then obtained when:

$$R_2 = R_3 = \frac{R}{2} - \frac{2kT}{q} \frac{R}{V_H - V_B} \text{Log } 3$$

According to a preferred embodiment the balance of the bridge is independent of the input and supply voltages, and for this purpose the first current source is arranged in a manner such that its current I varies according to a given law, that is to say:

$$I = \frac{V_{cc} - V_e}{R}$$

According to an advantageous variant of this embodiment, the first current source is arranged as a current mirror circuit having a proportion K to a second current source whose amplitude is a function of the supply voltage and which applies a part of its current to a third current source whose amplitude is a function of the input voltage, so that the amplitude of the first current source is in accordance with the law mentioned hereinbefore.

The second current source may comprise a second resistor having a first terminal connected to the supply voltage source and a second terminal connected to the third current source, the second resistor being arranged such that the current of the second current source linearly depends on the value of the second resistor.

The proportion K between the currents of the second and fourth current sources preferably has a value of $$K = 2\frac{R_4}{R}$$

where $R_4$ is the value of the second resistor ($R_4$ in FIG. 5).

The third current source may comprise a second transistor whose base is coupled to said input voltage, whose collector is connected to said supply voltage source and whose emitter is connected in series with a third resistor and a fifth D.C. diode, and also a third transistor whose collector is connected to the second terminal of the second resistor to deliver the desired current, the junction point of the third resistor and the fifth diode being connected to the base of the third transistor.

Thus one obtains a current mirror circuit supplying a current as a function of the input voltage.

The dimensions of the third transistor and the fifth diode are preferably chosen such that they passed currents at a ratio N and in that:

$$N = \frac{R_{10}}{R_4}$$

$R_{10}$ designating the value of the third resistor ($R_{10}$ in FIG. 5).

A second current generator may be arranged for injecting a transient current to said first common end during a change from the sampling state to the blocking state so as to pass a transient current through the first differential stage.

The second current generator may, according to a preferred variant, comprise a further transistor ($T_{13}$ in FIG. 5) whose collector is connected to the supply voltage source, whose emitter is connected to the first common end (B) and whose base is connected to the supply voltage source via a further diode ($D_5$ in FIG. 5) connected in series with a fourth resistor ($R_5$ in FIG. 5) and also connected to an output terminal of a switching circuit arranged to connect it to a fourth current source ($Q_5$ in FIG. 5), whose amplitude is proportional to that of the first current source ($Q_2$ in FIG. 5), when the change is made from the first to the second state. The second and fourth diodes are advantageously of the Schottky type.

BRIEF DESCRIPTION OF THE DRAWINGS

The invention will be better understood by means of the following text, given by way of non-limiting example, with reference to the drawings in which.

DESCRIPTION OF THE PREFERRED EMBODIMENTS

Figure 1:
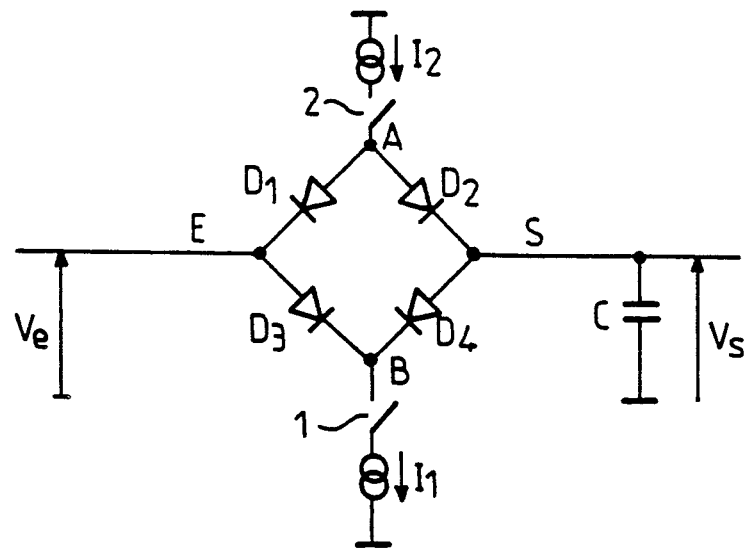
FIG. 1 shows a conventional prior-art sample-and-hold circuit.

FIG. 1 shows a conventional diagram of a sample-and-hold circuit. It shows a diode bridge having two branches, the one constituted by diodes $D_1$ and $D_3$ and the other by diodes $D_2$ and $D_4$. The junction point A of the diodes $D_1$ and $D_2$ is connected to a current source $I_2$ through a switch 2. The junction point B of the diodes $D_3$ and $D_4$ is connected to a current source $I_1$ through a switch 1. The junction point of the diodes $D_1$ and $D_3$ constitutes the input E of the sampler which receives an input signal $V_e$ to be sampled. The junction point of the diodes $D_2$ and $D_4$ constitutes the output S of the sampler. It is connected to a capacitor C which stores a voltage $V_s$.

In the sampling mode the switches 1 and 2 are closed. The voltage $V_s$ at the terminals of the capacitor C is a copy of the voltage $V_e$. One has $V_e = V_s$ when the current in the capacitor C is zero, the diodes $D_1$ and $D_2$ are identical as well as the diodes $D_3$ and $D_4$, and the current sources $I_1$ and $I_2$ supply a current of the same value.

In the blocking state, obtained by simultaneously opening the switches 1 and 2, the bridge presents a high-impedance state (infinite if the diodes are assumed to be perfect) and the voltage $V_s$ sampled previously is stored in the capacitor C.

This type of arrangement presents a certain number of disadvantages, that is to say:

the necessity of pairing the current sources $I_1$ and $I_2$;

the necessity of simultaneously switching the current sources $I_1$ and $I_2$;

the practical requirement to utilize a PNP transistor current source (source $I_2$) which contributes to limiting the switching rate in the case of the customary manufacturing methods for integrated circuits, for which the PNP transistors are slower than the NPN transistors.

Figure 2:
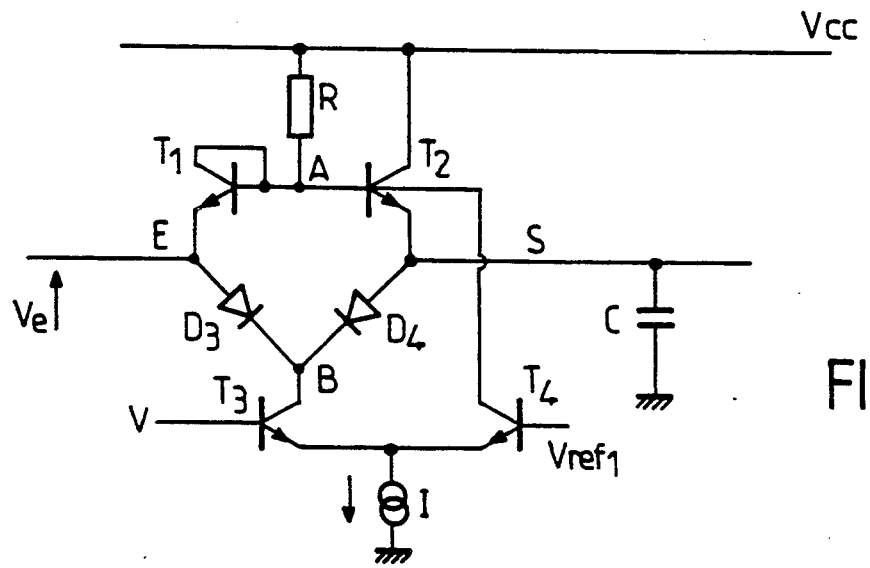
FIG. 2 shows a sample-and-hold circuit comprising a switching circuit according to the invention.

The circuit of FIG. 2 provides an embodiment in which no more than one current source switches and which may be done utilizing only NPN transistors for more speed in the case of the customary IC fabrication methods.

In lieu of the current source $I_2$ and the switch 2, a resistor R is inserted. The diode $D_1$ is realised in the form of an NPN transistor $T_1$ whose base and collector are short-circuited and whose emitter is connected to the input E. The diode $D_2$ is replaced by an NPN transistor $T_2$ whose emitter is connected to the output S and whose collector-base path is connected in parallel to the resistor R. The diode $D_1$ could be constructed differently but this embodiment ensures the best identity of the characteristics with the diode $D_2$. Finally, a current source I is inserted to be switched either at the junction point of the diodes $D_3$ and $D_4$ (point B) or at junction point A of the bases of the transistors $T_1$ and $T_2$.

A transistor $T_3$ of the NPN type has its collector connected to a first end common to the two serial branches, i.e. point B, and receives at its base a switching signal V. A transistor $T_4$ also of the NPN type has its collector connected to a second end common to the two serial branches, i.e. point A, its emitter connected to that of transistor $T_3$ and receives at its base a reference voltage $Vref_1$. The transistors T3, T4 form a first switchable differential stage which, together with the current source I, form a first switchable current source.

In the sampling mode ($V > Vref_1$) the transistor $T_3$ is conductive and transistor $T_4$ is blocked. The current passing through resistor R has for its value:

$$i = \frac{V_{cc} - V_{BET1} - V_e}{R}$$

$V_{BET1}$ designating the base-emitter voltage of the transistor $T_1$, $V_{cc}$ designating the supply voltage.

For another perfect copy of the voltage $V_e$ the current passing through the four bridge elements (transistor $T_1$, collector-emitter path of the transistor $T_2$, diodes $D_3$ and $D_4$) must be equal to I/2. The resistor R must thus pass a current equal to I/2 (disregarding the base current of the transistor $T_2$). We thus have:

$$R = 2 \frac{V_{cc} - V_{BET1} - V_e}{I} \quad (1)$$

It should be observed that the presence of transistor $T_2$ allows of an accelerated charging of the capacitor C.

In the blocked state ($V < Vref_1$), the transistor $T_4$ is conductive and the transistor $T_3$ is blocked. The resistor R then passes by a current equal to I. In the resistor R this current produces a voltage drop which is double the one obtained in the sampling mode, which makes it possible to cut off the transistors $T_1$ and $T_2$. No current passes through the diodes $D_3$ and $D_4$ any longer. The bridge is thus rapidly brought to a high-impedance state.

The structure described hereinbefore presents one approximation (formula (1)) because the sampling conditions are not independent of the voltage $V_e$ to be sampled.

Figure 3:
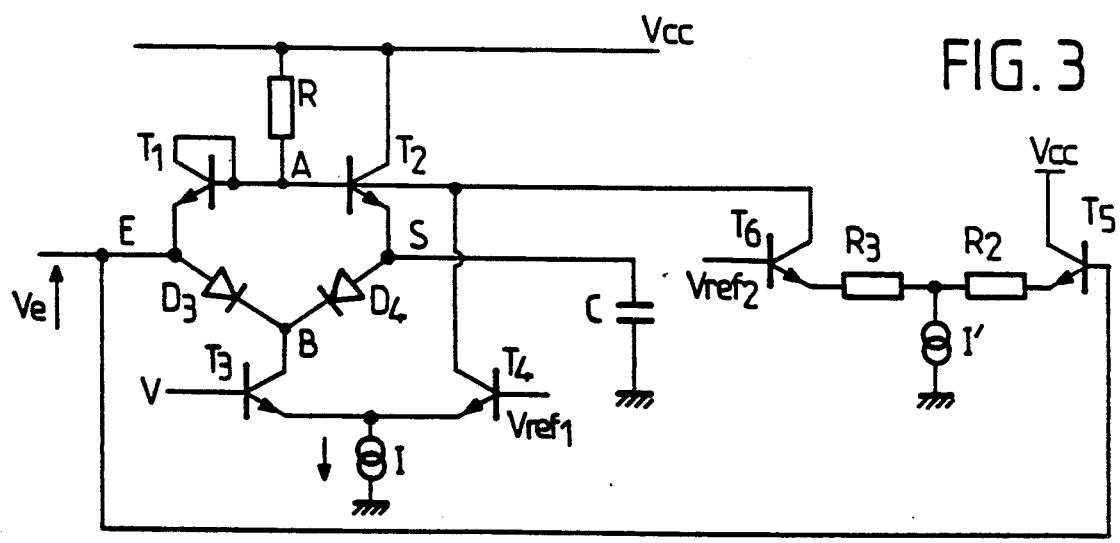
FIG. 3 shows a variant according to the invention, correcting the influence of the value of the input voltage on the stored voltage.

In FIG. 3 an improved circuit is proposed which comprises an equalizing circuit that may be added to other elements which are not modified for that matter. This circuit includes a current generator comprising a second switchable differential stage T5, T6 together with second and third series-connected resistors R2 and R3 and a second current source I'.

The equalizing circuit comprises two transistors $T_5$ and $T_6$ of the NPN type whose emitters may be connected by two series-connected linearizing resistors $R_2$ and $R_3$ to the junction point of which is connected a current source I'. The base of the (second) transistor $T_5$ is connected to the input E and its collector is connected to the source of supply voltage $V_{cc}$. The base of the (third) transistor $T_6$ receives a reference voltage $Vref_2$ and its collector is connected to the point A. The function of this equalizing circuit is to tap the excessive part of the current that passes through resistor R in order to maintain in the transistor $T_1$ a constant current equal to I/2 and to thus ensure the equality of the currents in the two branches of the bridge for any input voltage $V_e$.

Let us assume that $V_B$ is the minimum voltage to be sampled.

Let us assume that $V_H$ is the maximum voltage to be sampled.

Let us assume that $I_{6H}$ is the current passing through the transistor $T_6$ when $V_e = V_H$ and $I_{6B}$ is the current passing through the transistor $T_6$ when $V_e = V_B$.

We thus have:

$$\frac{V_{cc} - V_{BET1} - V_H}{R} = \frac{I}{2} + I_{6H} \quad (2)$$

$$\frac{V_{cc} - V_{BET1} - V_B}{R} = \frac{I}{2} + I_{6B} \quad (3)$$

from which:

$$I_{6B} - I_{6H} = \frac{V_H - V_B}{R}$$

All current I' may be chosen to pass through the transistors $T_5$ when $V_e = V_H$, that is, $I_{6H} = 0$.
We thus have:

$$R = \frac{2(V_{cc} - V_{BET1} - V_H)}{I}$$

All current I' may also be chosen to pass through the transistor $T_6$ when $V_e = V_B$, that is, $I_{6B} = I'$. With these two accumulated hypotheses we thus obtain:

$$I' = \frac{V_H - V_B}{R}$$

The function of resistors $R_2$ and $R_3$, having the same resistance value, is to improve the linearity. Their value may be calculated at the operating points where the current I' is distributed between the transistors $T_5$ and $T_6$ in a proportion of ¼, ¾. That is to say:

$$V_e = \frac{V_H + V_{ref2}}{2} \; ; \; et \; V_e = \frac{V_B + V_{ref2}}{2}$$

It will be sufficient to perform the calculation for either of the two operating points for reasons of symmetry of the structure.

Let us assume that $$V_e = \frac{V_H + V_{ref2}}{2} = \frac{3V_H + V_L}{4}$$

Let us assume that $I_{R2}$ is the current passing through resistor $R_2$ and that $I_{R3}$ is the current passing through the resistor $R_3$.

The linearity is ensured if at the aforementioned operating point:

$I_{R2} = \frac{1}{4} I'$ $I_{R3} = \frac{3}{4} I'$

The result is that the equality of the voltages at the common point of the resistors $R_2$ and $R_3$ can be written as:

$$\frac{3V_H + V_B}{4} - V_{BET5} - \frac{3}{4} R_2 I' = \frac{V_H + V_B}{2} - V_{BET6} - R_2 I'$$

$V_{BET5}$ and $V_{BET6}$ designating the base-emitter voltage of the transistors $T_5$ and $T_6$.

From which $$\frac{R_2 I'}{2} = \frac{V_H - V_B}{4} - (V_{BET5} - V_{BET6})$$

Assuming that $$R_2 = R_3 = \frac{1}{I'} \left( \frac{V_H - V_B}{2} - \frac{2kT}{q} \log 3 \right)$$

From which $$R_2 = R_3 = \frac{R}{2} - \frac{2kT}{q} \log 3 \times \frac{R}{V_H - V_B}$$

Figure 4:
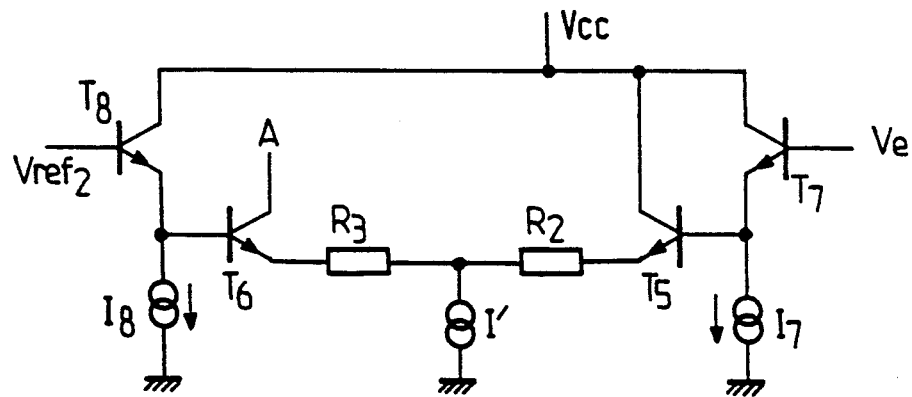
FIG. 4 shows a version of this variant providing improved linearity.

The permissible dynamic for the sampler may be augmented by introducing level shifting diodes. FIG. 4 shows an embodiment in which transistors $T_7$ and $T_8$ are arranged as emitter-followers and have current sources $I_7$ and $I_8$ connected to their respective emitters. These transistors are connected to the bases of transistors $T_5$ and $T_6$, respectively, so as to deliver their respective input signals $V_e$ and $V_{ref2}$ to transistor $T_5$ and $T_6$.

Figure 5:
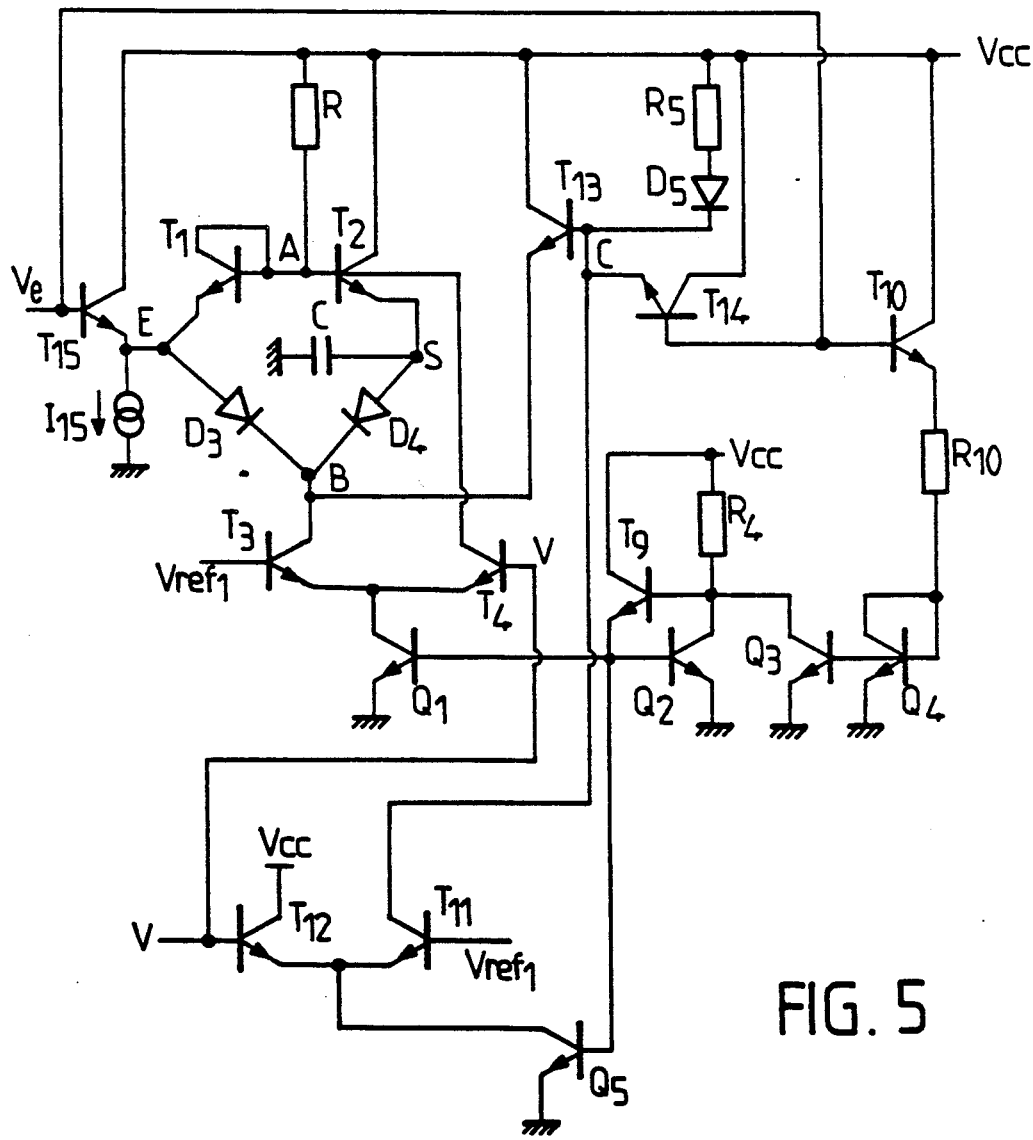
FIG. 5 shows a preferred embodiment of the invention providing static (input and supply voltages) and dynamic corrections.

According to FIG. 5 the current source I is realised in a manner such that it balances currents in the two branches and thus the quality of the copy does not depend on any variations, more specifically as a function of temperature, of the input voltage or the value of the supply voltage $V_{cc}$ either.

This object is achieved when using the transistors $Q_1$ to $Q_4$, $T_9$ and $T_{10}$ for obtaining the desired variation law for the current I.

The input voltage $V_e$ is shifted by a base-emitter voltage $V_{be}$ with the aid of a transistor $T_{15}$ having its emitter coupled to a current source $I_{15}$.

Under these conditions, the formula (1) becomes:

$$I = 2\frac{V_{cc} - V_e}{R} \quad (4)$$

The current I is produced by a transistor $Q_1$ whose collector is connected to the coupled emitters of the transistors $T_3$ and $T_4$ and whose emitter is connected to the common mode pole. The transistor $Q_1$ forms a current mirror circuit having the proportion K to a transistor $Q_2$. The transistor $Q_2$ has its base connected to that of the transistor $Q_1$, its collector connected to the supply voltage $V_{cc}$ through a resistor $R_4$ and its emitter connected to the common mode pole. A transistor $T_9$ has its collector connected to the supply voltage $V_{cc}$, its base to the collector of the transistor $Q_2$ and its emitter to the interconnected bases of the transistors $Q_1$ and $Q_2$. The current passing through the collector of the transistor $Q_2$ thus linearly depends on the value of the resistor $R_4$ (and the supply voltage $V_{cc}$). In order to calculate the current passing through the resistor $R_4$, the latter is considered to be connected in series to two diodes. A transistor $Q_3$ has its collector connected to that of the transistor $Q_2$, its emitter to the common mode pole and has its base connected to that of the transistor $Q_4$ arranged as a diode by means of a short-circuited base-collector with which it forms a second current mirror circuit having a ratio N. A transistor $T_{10}$ receives on its base the input signal $V_e$, has its collector connected to the supply voltage source $V_{cc}$ and its emitter to the base of transistor $Q_4$ through a resistor $R_{10}$.

Let us assume that K is the proportion between the emitter dimensions of the transistors $Q_1$ and $Q_2$, and N the proportion between the emitter dimensions of the transistors $Q_3$ and $Q_4$.

Let us assume that $I_{Q1}$, $I_{Q2}$, $I_{Q3}$, $I_{Q4}$ and $I_{R4}$ are the respective currents in the collectors of transistors $Q_1$, $Q_2$, $Q_3$ and $Q_4$, and the current flow through the resistor $R_4$.

We then have $I_{Q1} = I$.
Alternatively:

$$I_{Q1} = kI_{Q2} = K(I_{R4} - I_{Q3}) = K(I_{R4} - NI_{Q4})$$

We have $$I_{R4} = \frac{V_{cc} - 2V_{BE}}{R_4}$$

-continued $$I_{Q4} = \frac{V_e - 2V_{BE}}{R_{10}}$$

where $$I_{Q1} = K\left(\frac{V_{cc} - 2V_{BE}}{R_4} - N\frac{V_e - 2V_{BE}}{R_{10}}\right)$$

$$I_{Q1} = K\frac{V_{cc}}{R_4} - \frac{KN}{R_{10}}V_e + 2KV_{BE}\left(\frac{N}{R_{10}} - \frac{1}{R_4}\right)$$

This expression is to be identified with the formula (4), where:

$$\frac{2}{R} = \frac{K}{R_4} = \frac{KN}{R_{10}}$$

Let us assume that $R_{10} = NR_4$ and $$R_4 = \frac{KR}{2}$$

thus $$R_{10} = \frac{KNR}{2}$$

Under these conditions the balance of the bridge is independent of the voltage $V_e$ and the supply voltage $V_{cc}$, which thus also suppresses the temperature derivatives of these parameters.

The circuit represented in FIG. 5 also includes means intended to improve the dynamic operation while ensuring the simultaneity of the blocking of the current in the transistors $T_1$ and $T_2$ and also the diodes $D_3$ and $D_4$. The blocking of the transistors $T_1$ and $T_2$ occurs when the transistor $T_4$ passes the current $I_2$. Actually, at that moment the potential at point A has for its value $V_{cc} - V_e$ and the whole current passing through resistor R passes through the transistor $T_4$ as well. In contradistinction thereto, the collector current of the transistor $T_3$ temporarily continues to flow through the diodes $D_3$ and $D_4$ until transistor $T_3$ is blocked.

The current passing through diode $D_4$ during this temporary situation is produced by the capacitor C which is slightly discharged. This introduces a slight systematic error in the value of the stored voltage.

A transistor $T_{13}$ has its collector connected to the supply voltage source $V_{cc}$ and its emitter to the point B (the junction point of the cathodes of diodes $D_3$ and $D_4$ and the collector of transistor $T_3$) and has for its function to supply to the collector of transistor $T_3$ said transient current in order to ensure said simultaneous blocking state and to avoid said temporary discharge of the capacitor C. In order to realize this its base is connected to a terminal of a serial branch comprising a resistor $R_5$ and a diode $D_5$, the other terminal of the branch being connected to the supply voltage source $V_{cc}$. A transistor $T_{15}$ whose emitter is connected to the input E of the bridge shifts the level of the input signal $V_e$ by $V_{BE}$. A current source $I_{15}$ forces a continuous current into its emitter. The diodes $D_3$ and $D_4$ are Schottky diodes. The base of the transistor $T_{13}$ is connected to the collector of a transistor $T_{11}$ whose emitter is coupled to that of a transistor $T_{12}$ whose collector is connected to the supply power voltage source $V_{cc}$. The bases of the transistors $T_{11}$ and $T_{12}$ receive the respective voltages $V_{ref_1}$ and V, that is to say, that their operation is simultaneous with that of the transistor pair $T_3$ and $T_4$. A current source (transistor $Q_5$) is connected to the emitters of the transistors $T_{11}$ and $T_{12}$. The base of the transistor $Q_5$ is connected to that of the transistor $Q_2$ so that identical currents pass through the collectors of these two transistors if the transistors have the same dimension. If the bridge is conductive, $V_e$ has a low level, the transistor $T_{11}$ is conductive and the transistor $T_{13}$ is blocked. If the bridge blocks, the transistor $T_{13}$ is conductive so that it produces the transient current needed by the collector of the transistor $T_3$.

The operating conditions are thus the following:
if the bridge is conductive, the base of transistor $T_{13}$ (point C) is to be $V_e - V_{BE}$. Its base-emitter voltage thus has in effect the value $V_{DS}$, the voltage of a D. C. Schottky diode (0.5 V) and the transistor $T_{13}$ is blocked. If $Q_2$ and $Q_5$ have the same dimension, one has $I_{Q2} = I_{Q5}$, $I_{Q5}$ designating the collector current of $Q_5$, from which:

$$I_{Q5} = \frac{1}{K} \frac{2(V_{cc} - V_e)}{R} = \frac{R}{R_4} \frac{V_{cc} - V_e}{R} = \frac{V_{cc} - V_e}{R_4}$$

The potential at the base of the transistor $T_{13}$ thus has the value:

$$V_{cc} - \frac{R_5}{R_4}(V_{cc} - V_e) - V_{BE} \leq V_e - V_{BE}$$

where $R_5 \geq R_4$.

When the bridge is blocked, the voltage V increases rendering transistor $T_{12}$ conductive and blocking transistor $T_{11}$.

The potential of the base of the transistor $T_{13}$ increases, and this may thus supply the transient current to transistor $T_3$.

As the diodes $D_3$ and $D_4$ are of the Schottky type (D.C. voltage $V_{DS}$ (~0.5 Volt), the voltage swing on the collector of transistor $T_{11}$ is equal to $(V_{BE} - V_{DS}) - 0.3$ V to render the transistor $T_{13}$ conductive.

This small swing permits a very fast response.

It is possible to improve the security of the blocking state of the transistor $T_{13}$ when the bridge is fed by choosing $R_5 > R_4$ and adding one transistor $T_{14}$ whose base receives the input voltage $V_e$, whose collector is connected to the supply voltage source $V_{cc}$ and whose emitter is connected to the point C.

The invention is not restricted to the embodiments described and represented hereinbefore. More particularly, the diodes $D_3$ and $D_4$ are not of necessity Schottky diodes if transistor $T_{13}$ is used in the dynamic correction structure. In effect, it is sufficient that, for example, the proportion between the dimensions of the transistor $T_{13}$ and the diodes $D_3$ and $D_4$ realised in this hypothesis on the basis of bipolar transistors is such that a negligibly small current passes through transistor $T_{13}$ when the bridge is conductive.

It should furthermore be observed that all of the functions and particularly the improvement of the dynamic operation are realised with the aid of transistors of the same type, preferably the NPN type, which makes it possible to avoid the dissimilarities due to different properties, more specifically in transient condition of different types of transistors.

In particular, the improvement of the dynamic operation can be realised with transistors of the same type as those used for switching the first switchable current source (in particular the second current source and the first differential stage).

I claim:

1. A switching circuit comprising: a diode bridge that includes a first serial branch comprising first and second diodes, connected in parallel to a second serial branch comprising third and fourth diodes with at least one first end common to the two serial branches connected to a first switchable current source providing a first state in which it is coupled to the first common end and a second state in which it is uncoupled from the first common end, the first serial branch having an input terminal at a junction point of the first and second diodes for receiving an input voltage, the second serial branch having an output terminal at a junction point of the third and fourth diodes, wherein the third diode comprises the base-emitter path of a first transistor having a collector connected to a supply voltage source, a second end common to said two branches being a junction point of the first and third diodes, a first resistor connected between said second common end and said supply voltage source, and wherein the first switchable current source is coupled to the second common end in said second state.

2. A circuit as claimed in claim 1, wherein the first switchable current source comprises a first switchable differential stage connected so as to switch a current source to said first and second common ends in the first state and in the second state, respectively, in response to a control signal.

3. A circuit as claimed in claim 2, which further comprises a current generator arranged to inject at the second common end an equalizing current that varies with the input voltage so as to render the balance of the bridge independent of said input voltage.

4. A circuit as claimed in claim 3, wherein the current generator comprises a second switchable differential stage arranged so that said equalizing current is derived from a second current source.

5. A circuit as claimed in claim 4, wherein the second differential stage comprises second and third transistors whose emitters are coupled through second and third series-connected resistors to a junction point which is connected to the second current source, a base of the second transistor receiving said input voltage and its collector being connected to the supply voltage source, a base of the third transistor receiving a reference voltage and its collector being connected to said second common end.

6. A circuit as claimed in claim 5, wherein the base-emitter paths of the second and third transistors are connected in series with respective fourth and sixth level shifting diodes.

7. A circuit as claimed in claim 5, wherein the second current source has the following amplitude:

$$I = \frac{V_H - V_B}{R}$$

with $R = \frac{2}{I}(V_{cc} - V_{BE} - V_H)$ $V_H$: maximum value of the input signal $V_e$ $V_B$: minimum value of the input signal $V_e$
R: value of the first resistor
$V_{BE}$: base-emitter voltage of a transistor
$V_{cc}$: supply voltage
I: amplitude of the first current source.

8. A circuit as claimed in claim 7, wherein the second ($R_2$) and third ($R_3$) resistors have the same value, equal to:

$$R_2 = R_3 = \frac{R}{2} - \frac{2kT}{q} \frac{R}{V_H - V_B} \text{Log } 3$$

9. A circuit as claimed in claim 2, wherein the first current source provides a current (I) that varies according to a given law as follows:

$$I = \frac{V_{cc} - V_e}{R}$$

where
$V_{cc}$ = the supply voltage
$V_e$ = the input voltage
R = resistance value of the first resistor.

10. A circuit as claimed in claim 9, wherein the first current source comprises a current mirror circuit having a proportion K to a second current source whose amplitude is a function of the supply voltage and which applies a part of its current to a third current source whose amplitude is a function of the input voltage, whereby the amplitude of the first current source is in accordance with said given law.

11. A circuit as claimed in claim 10, wherein the second current source comprises a second resistor having a first terminal connected to the supply voltage source and a second terminal connected to the third current source, the second resistor being connected such that the current of the second current source linearly depends on the value of the second resistor.

12. A circuit as claimed in claim 11, wherein the proportion K between the currents of the first and second current sources has a value of:

$$K = 2\frac{R_4}{R}$$

where $R_4$ is the resistance value of the second resistor.

13. A circuit as claimed in claim 11 wherein the third current source comprises a second transistor whose base is coupled to said input voltage, whose collector is connected to said supply voltage source and whose emitter is connected in series with a third resistor and a fifth diode, and a third transistor whose collector is connected to the second terminal of the second resistor to deliver the desired current, a junction point of the third resistor and the fifth diode being connected to the base of the third transistor.

14. A circuit as claimed in claim 13, wherein the dimensions of the third transistor and of the fifth diode are chosen such that they pass currents in a ratio N, wherein:

$$N = \frac{R_{10}}{R_4}$$

$R_{10}$ designating the value of the third resistor and $R_4$ designating the value of the second resistor.

15. A circuit as claimed in claim 13 which comprises a current generator for injecting a transient current to said first common end (B) during a change from the first state to the second state.

16. A circuit as claimed in claim 15, wherein the current generator comprises a fourth transistor whose collector is connected to the supply voltage source, whose emitter is connected to the first common end and whose base is connected to the supply voltage source via a sixth diode connected in series with a fourth resistor and also connected to an output terminal of a switching circuit for connecting it to a fourth current source, whose amplitude is proportional to that of the first current source, when a change is made from the first to the second state.

17. A circuit as claimed in claim 3, characterised in that the second ($D_3$) and fourth ($D_4$) diodes comprise Schottky diodes.

18. A circuit as claimed in claim 16 wherein the first and fourth current sources have the same amplitude and in that:

$$R_5 \geq R_4$$

$R_5$ and $R_4$ designating the resistance values of the fourth and second resistors, respectively.

19. A circuit as claimed in claim 15 wherein the first switchable current source and the current generator comprise semiconductor elements of the same type.

20. A sample-and-hold circuit comprising a switching circuit according to claim 1 and a memory capacitor connected to said output terminal of the switching circuit, the first state being a sampling state and the second state being a blocking state.

21. A circuit as claimed in claim 4 wherein the second current source has the following amplitude:

$$I' = \frac{V_H - V_B}{R}$$

with $R = \frac{2}{I}(V_{cc} - V_{BE} - V_H)$ $V_H$: maximum value of the input signal $V_e$
$V_B$: minimum value of the input signal $V_e$
R: value of the first resistor
$V_{BE}$: base-emitter voltage of a transistor
$V_{cc}$: supply voltage
I: amplitude of the first current source.

22. A circuit as claimed in claim 10 wherein the third current source comprises a second transistor whose base is coupled to said input voltage, whose collector is connected to said supply voltage source and whose emitter is connected in series with a second resistor and a fifth diode, and a third transistor whose collector is connected to a terminal of a third resistor to deliver a desired current, a junction point of the second resistor and the fifth diode being connected to the base of the third transistor.

23. A circuit as claimed in claim 1 which further comprises a current generator for injecting a transient current to said first common end during a change from the first state to the second state.

24. A circuit as claimed in claim 3 which further comprises a second current generator for injecting a transient current to said first common end during a change from the first state to the second state.

25. A switching circuit as claimed in claim 1 wherein;

the first switchable current source comprises a differential amplifier including second and third transistors coupled to said first and second common ends, respectively, and to a current source common to said second and third transistors, means for applying a control signal to a control electrode of one of said second and third transistors whereby said current source is exclusively coupled to said first and second common ends in said first and second states, respectively, and a capacitor coupled to said output terminal.

* * * * *